United States Patent
Von Borcke et al.

(10) Patent No.: US 7,800,171 B2
(45) Date of Patent: Sep. 21, 2010

(54) INTEGRATED CIRCUIT INCLUDING A SEMICONDUCTOR DEVICE

(75) Inventors: Mathias Von Borcke, Munich (DE);
Markus Zundel, Egmating (DE);
Thorsten Meyer, Munich (DE); Uwe Schmalzbauer, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 98 days.

(21) Appl. No.: 11/870,750

(22) Filed: Oct. 11, 2007

(65) Prior Publication Data

US 2008/0088355 A1 Apr. 17, 2008

(30) Foreign Application Priority Data

Oct. 13, 2006 (DE) .................... 10 2006 048 625

(51) Int. Cl.
*H01L 21/336* (2006.01)
(52) U.S. Cl. ............... 257/331; 257/335; 257/330; 257/E29.257; 438/270
(58) Field of Classification Search ......... 257/328–331, 257/332–334, E29.257; 438/270
See application file for complete search history.

(56) References Cited

U.S. PATENT DOCUMENTS 5,643,821 A * 7/1997 Beasom .................... 438/355
5,663,574 A * 9/1997 Hierold et al. ............... 257/48
6,144,085 A * 11/2000 Barker ...................... 257/467

FOREIGN PATENT DOCUMENTS

DE 102004021393 A1 12/2005
DE 102004024887 A1 12/2005

* cited by examiner

*Primary Examiner*—Thinh T Nguyen
(74) *Attorney, Agent, or Firm*—Dicke, Billig & Czaja, PLLC

(57) ABSTRACT

An integrated circuit including a semiconductor device is disclosed. One embodiment provides a load current component, having a multiplicity of trenches in a cell array. A sensor component is integrated into the cell array of the load current component and has a sensor cell array, the area of which is smaller than the area of the cell array of the load current component by a specific factor. The trenches forming the cell array of the sensor component correspond to the trenches of the cell array of the load current component, configured such that the trenches of the sensor component at the at least one side merge uniformly into the trenches of the cell array of the load current component without interruptions or disturbances of the trench geometry.

12 Claims, 6 Drawing Sheets

| | Gate oxide trenches |
| --- | --- |
| | Gate oxide trenches, body implant, body contact, source implantation and contact with metal |
| | $n_+$ source implant strip $S_{imp}$ |
| | Thick oxide trenches $D_t$ |
| | Metal M |
| | Body implantation, body contact |

Trenches ||||  Interrupted by thick oxide trenches ||||

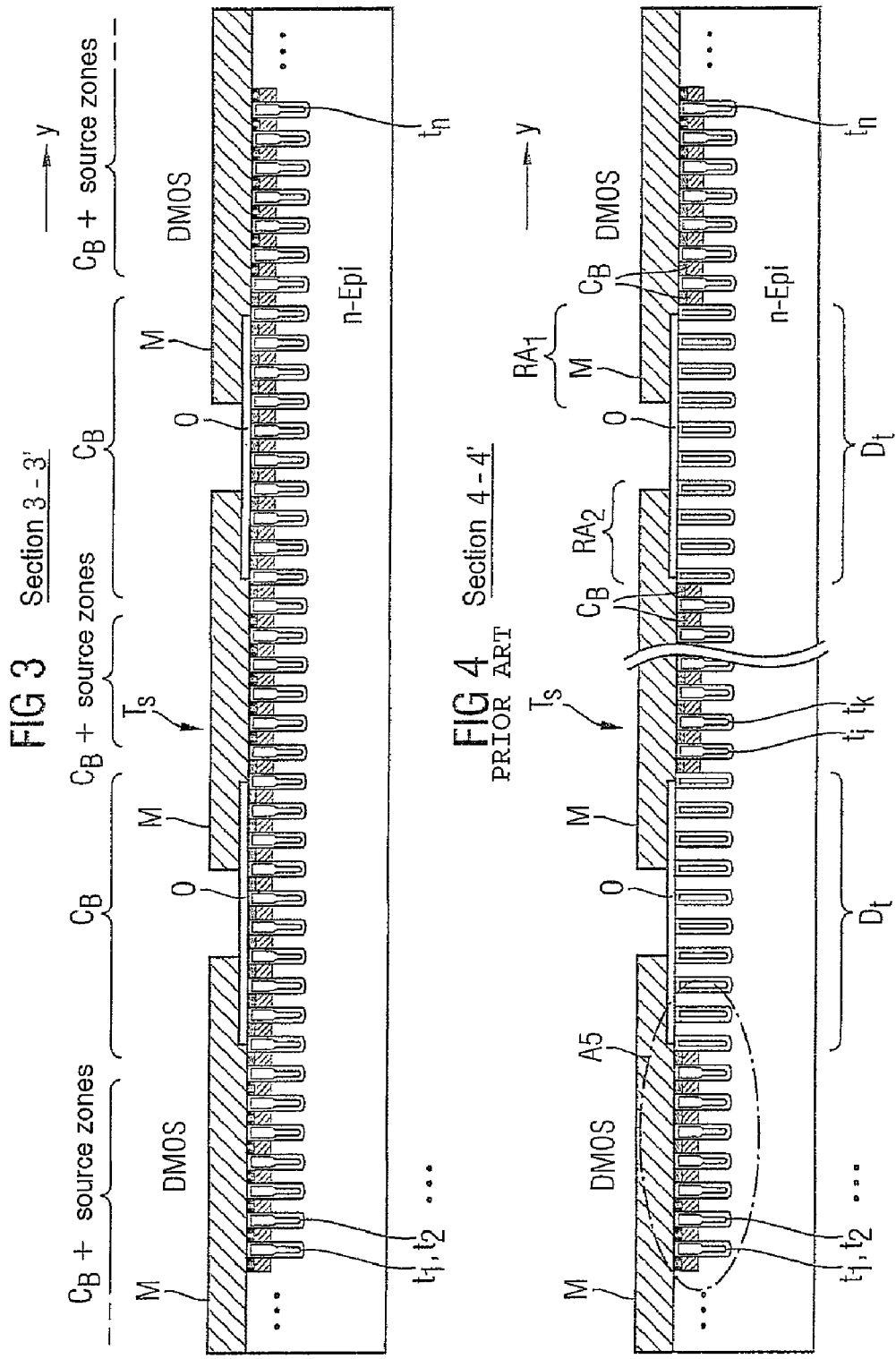

FIG 5
PRIOR ART
Enlarged excerpt A5
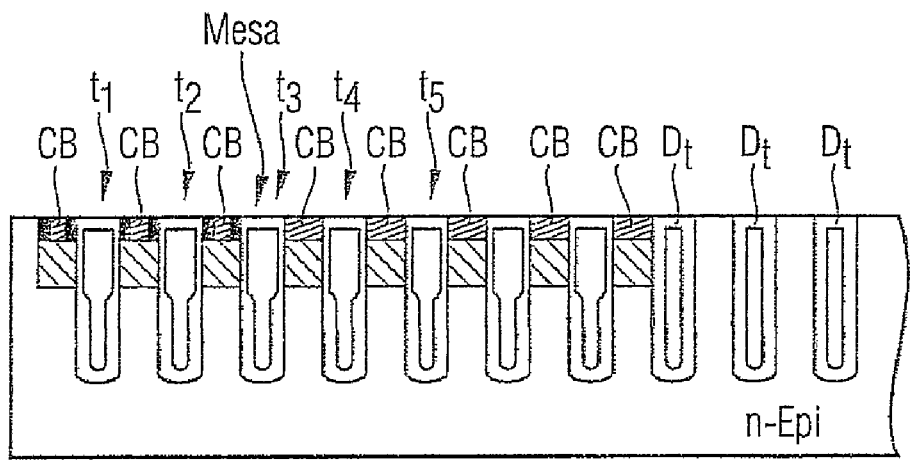
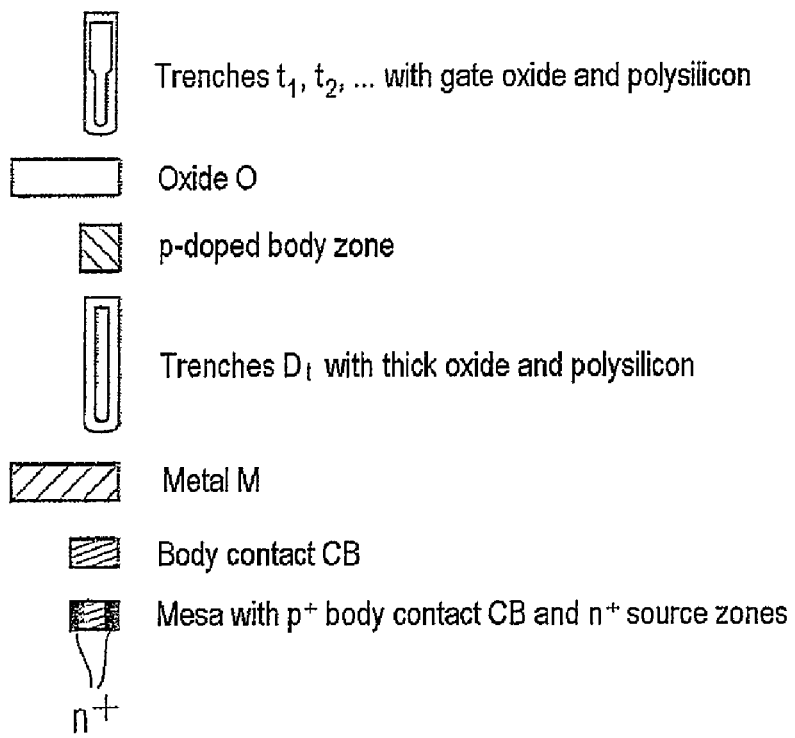
Trenches $t_1$, $t_2$, ... with gate oxide and polysilicon
Oxide O
p-doped body zone
Trenches $D_t$ with thick oxide and polysilicon
Metal M
Body contact CB
Mesa with $p^+$ body contact CB and $n^+$ source zones

INTEGRATED CIRCUIT INCLUDING A SEMICONDUCTOR DEVICE

CROSS-REFERENCE TO RELATED APPLICATIONS

This Utility Patent Application claims priority to German Patent Application No. DE 10 2006 048 625.0 filed on Oct. 13, 2006, which is incorporated herein by reference.

BACKGROUND

The invention relates to an integrated circuit including a semiconductor device. In one embodiment the device includes a load current component, which has a multiplicity of trenches in a cell array, and a sensor component, which is integrated into the cell array of the load current component and has a sensor cell array, the area of which is smaller than the area of the cell array of the load current component by a specific factor, wherein measures are taken for an integration of the sensor component into the cell array of the load current component that is optimized with regard to matching.

In order to realize self-protecting MOS power switches, it is customary inter alia to integrate a current sensor on the power switch chip. The accompanying FIG. 7 illustrates a schematic circuit example of a MOS power switch equipped with a current sensor in high-side applications, the MOS transistors of said switch being n-DMOS transistors.

In a common embodiment, the current sensor is realized as a small DMOS sensor transistor Ts, which supplies a current proportional to the load current $I_L$ flowing through the load DMOS transistor if it is connected up to voltages identical to those of the load DMOS. Said DMOS sensor transistor Ts is e.g., a factor of 1000-10 000 smaller than the load DMOS, and a sensor current flows through it which is smaller than the load current $I_L$ through the load DMOS ideally by the geometrical ratio of the active areas of the two transistors, namely load DMOS and sensor transistor Ts. This ratio is called the ideal ratio $K_G$ of the currents hereinafter, to distinguish from the real ratio K of the currents.

If the integrated MOS power switch, as illustrated in FIG. 7, is realized using a common-drain technology, both transistors, that is to say load DMOS and sensor transistor Ts, have the same drain potential and the same gate potential. The source potential of the load DMOS is tapped off, as is illustrated e.g., in FIG. 7, and the source potential of the sensor transistor Ts is adjusted to the same potential. The real ratio K of the currents thus represents de facto the quotient of the on resistances of sensor transistor Ts and load DMOS.

In a practical embodiment, given a low load current, load DMOS and sensor transistor Ts are operated with a smaller gate-source voltage since, at high gate-source voltages, the voltage drop across the load DMOS would be small and the offset voltage of the differential amplifier U1 would correspondingly have a greater influence on the accuracy of the current measurement. Under these conditions, load DMOS and sensor transistor Ts are operated with a gate-source voltage near the threshold voltage and hence at an operating point at which the channel resistance predominates over the on resistance of the DMOS transistors. A difference in the threshold voltages of the two transistors, load DMOS and sensor transistor Ts, leads to large deviations of the real current ratio K from the ideal geometrical ratio Kg at this operating point.

Two operating modes are realized in practice:
operation with a high gate-source voltage even given small load currents. A good matching of the on resistance $R_{ON}$ is important in this case. The accuracy of the current measurement is in this case limited by the offset of the differential amplifier connected downstream (cf. accompanying FIG. 7).
operation with a low gate-source voltage given small load currents. A good matching of the threshold voltage $V_{ES}$ of the load DMOS and of the sensor transistor is important in this case since said matching limits the accuracy of the current measurement. The matching of the on resistance $R_{ON}$ is once again important given large load currents (and a large gate-source voltage).

In order to obtain a good accuracy of the current sensor under different operating conditions, load DMOS and sensor transistor Ts must have a good matching. Here matching should be understood to mean a coordination of the characteristic curves and identical threshold voltages of the two transistors. Furthermore, the sensor transistor is intended to be embedded into the active region of the load DMOS as well as possible in order to obtain a current density that is as homogeneous as possible in the vicinity of the sensor transistor Ts and thus comparable voltage drops e.g., in the substrate of the integrated MOS power switch.

A further embodiment for the embedding of the sensor transistor Ts is the ideally identical temperature of the two transistors. In the case of the conventional integrated MOS power switches, the distance between the load DMOS and the sensor transistor is relatively large in order to take account e.g., of the design rules (metal pitch, metal overlap) applicable in the customary technologies. In order to realize the embedding of the sensor transistor as well as possible, it may be necessary to minimize the distances between the sensor transistor and the load DMOS transistor.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 illustrates a schematic cross-sectional illustration through the exemplary embodiment of the N-DMOS power switch in accordance with FIG. 1 along the sectional line 3-3'.

FIG. 4 illustrates a schematic cross section through a conventional N-DMOS power switch along the sectional line 4-4' in FIG. 2.

FIG. 5 illustrates an enlarged illustration of the excerpt A5 in FIG. 4.

DETAILED DESCRIPTION

Figure 1:
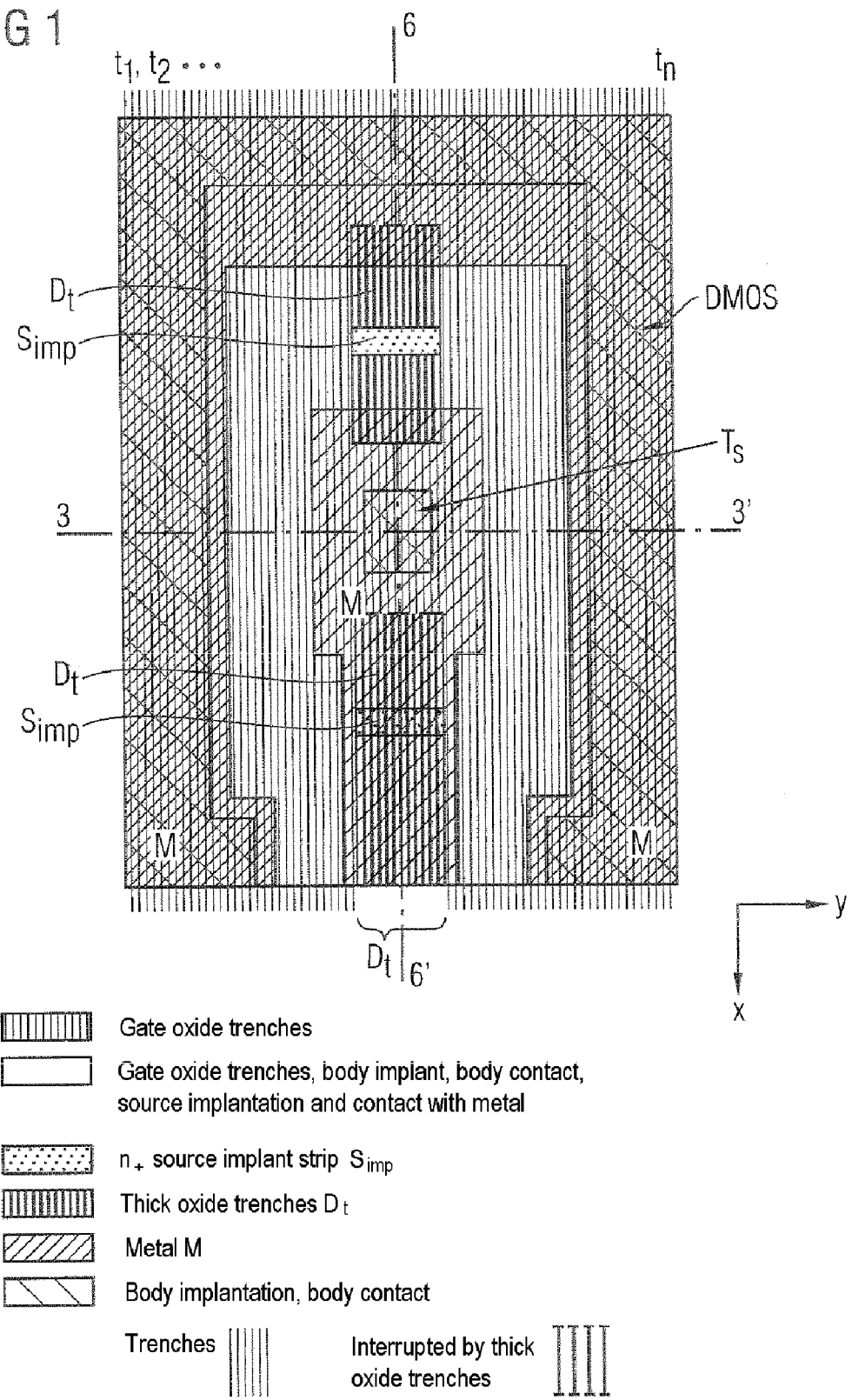
FIG. 1 schematically illustrates a layout view of an exemplary embodiment of an integrated circuit including a semiconductor device proposed in the form of an integrated N-DMOS power switch.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a semiconductor device and particularly an integrated MOS power switch of the generic type such that a better matching of the properties of the load current component and the sensor component is obtained, and thereby to provide the basis for the realization of a sensor transistor that operates with high accuracy. Furthermore, in the case of the semiconductor device proposed, the intention is to improve the embedding of the sensor component into the cell array of the load current component by reducing the distance between the active region of the load current component and the active region of the sensor component.

In one embodiment, the way in which the embodiment is achieved in the manner proposed by the invention is based on the principle of disturbing the homogeneity of the cell array as little as possible by the division into load current component and sensor component.

One embodiment provides a semiconductor device including a load current component, which has a multiplicity of trenches in a cell array, and a sensor component, which is integrated into the cell array of the load current component and has a sensor cell array, the area of which is smaller than the area of the cell array of the load current component by a specific factor, wherein the trenches forming the cell array of the sensor component correspond to the trenches of the cell array of the load current component in terms of their geometry, regular sequence and their construction at least one side of the sensor component, such that the trenches of the sensor component at the at least one side merge uniformly into the trenches of the cell array of the load current component without interruptions or disturbances of the trench geometry.

In one embodiment, the sensor component is a FET having source, gate and drain electrodes and is integrated as current sensor for detecting a current flowing through the load current component, which is configured as a FET, and wherein on the one hand the gates in each case of the load current component and of the sensor component and on the other hand the drain electrodes in each case of the load current component and of the sensor component are shared.

Furthermore, in the semiconductor device corresponding to this embodiment, on both sides of a transition from the cell array of the load current component to that of the sensor component, regions which carry the respective source potential are present in identical fashion on the part of the load current component and sensor component.

What is achieved by using the last-mentioned measures is that the at least one side of the sensor transistor merges into the cell array of the load current component in a regular sequence and in virtually unchanged fashion with regard to the potential distributions (geometries) used (that is to say that the potential regions/profiles are distributed in identical fashion in the transition from the cell array of the load current component to the cell array of the sensor component).

As far as the embodiment of the improved embedding of the sensor transistor into the cell array is concerned, in a further embodiment of the MOS power switch according to the invention, the sensor transistor, at the at least one side, is directly in contact with one side of the cell array of the load transistor in the sense that sensor cells to which sensor potential is applied and cells to which cell array potential of the load transistor is applied are at a distance of less than two pitches from one another.

In one embodiment, the sensor component can be rectangular in a layout view.

In a further embodiment, as well as at the one side, the trenches forming the cell array of the sensor component (Ts) correspond to the trenches of the cell array of the load current component in terms of geometry, regular sequence and construction at its other sides, too.

In one embodiment, a source implant strip is formed above and below the sensor transistor as seen in the direction of the trench course, said source implant strip being $n^+$-doped in the case of an NDMOS load current component and an NDMOS sensor component in order to suppress a possible parasitic MOS transistor at the surface (p-channel at the surface of the $n^-$-doped silicon between the two p-type body regions of load current component and sensor component or between sensor component and other p-type regions on the chip).

In one or more embodiments, principles of the semiconductor device can also be applied to other trench transistors, such as e.g., to P-DMOS, N-FET compensation devices, P-FET transistors and also to IGBTs with a trench construction.

The above and further features of a semiconductor device proposed will become even clearer in the following detailed description of embodiments, which refers to the accompanying figures of the drawing, through a comparison with a conventional integrated MOS power switch. In this case, it should be noted that the layout and sectional illustrations illustrated in the figures of the drawing are not to scale and in no way reproduce the real size relationships, and that the distance between load transistor and sensor transistor is depicted relatively large in FIGS. 2 and 4 in order for example to take account of the design rules applicable in the underlying technology.

In the figures, identical regions, units and details are identified by the same reference numerals in each case. Furthermore, all the doped regions can also be doped inversely, that is to say that n-type regions then become p-doped regions, and p-type regions become n-type regions.

With the present doping of the exemplary embodiment described, the load current component and also the sensor component are both DMOS transistors of the n type.

Figure 2:
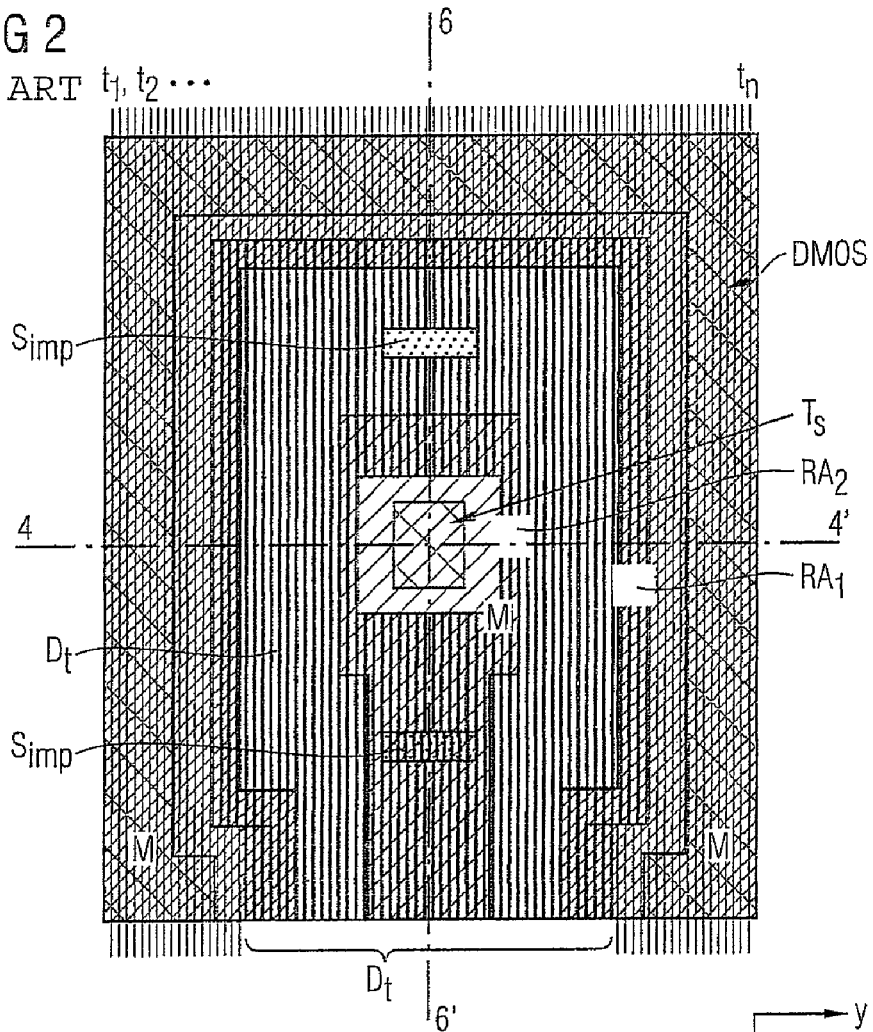
FIG. 2 illustrates for comparison a schematic layout view of a conventionally embodied integrated N-DMOS power switch.

In the schematic layouts—illustrated in FIGS. 1 and 2—of small sections of respectively a MOS power switch according to the invention and a conventional integrated MOS power switch, the gate oxide trenches t1, t2, . . . , tn, depicted as thin lines, run parallel and at the same distance with respect to one another in the x direction, that is in the drawing the direction from top to bottom. The thick oxide trenches Dt serving for delimiting and insulating the sensor transistor Ts illustrated in the center of FIGS. 1 and 2 likewise run in the x direction, but are depicted as thicker lines in order to better highlight them. The obliquely hatched areas are metal areas M. The entire region illustrated with the exception of the sections with the thick oxide trenches Dt depicted thicker and the source implantations Simp explained below represents a body implantation and body contacts, which will become even clearer further below on the basis of the sectional views in FIGS. 3 to 6.

As illustrated in FIG. 2, use has been made, for both transistors, that is to say the DMOS load transistor DMOS and the DMOS sensor transistor Ts, of in each case a complete edge termination construction, that is to say lateral edge terminations $RA_1$ and $RA_2$ which terminate in the y direction and vertical edge terminations (not designated) which terminate in the X direction. This means, inter alia, a transition from gate oxide trenches t1, t2, ..., tn to thick oxide trenches Dt. As a result, the symmetry/homogeneity of the DMOS area is already broken relatively early in the production process at this location. The implantation of the body region and of the body contact was likewise interrupted at all sides of the sensor (FIG. 2: region with the thick oxide trenches). These inhomogeneities are highly likely to cause a poor matching, that is to say that the threshold voltages and the on resistances of load transistor DMOS and sensor transistor Ts are different and lead to large deviations of the real current ratio K from the ideal geometrical ratio Kg at the operating point.

Both in the case of the conventional integrated MOS power switch illustrated in FIG. 2 and in the case of the MOS power switch in accordance with FIG. 1, the sensor transistor Ts is located in the cell array of the load transistor DMOS and has a rectangular layout in the example. This rectangular form is only by way of example and not restrictive. Other forms may be expedient.

The layout of the integrated MOS power switch as illustrated in FIG. 1 keeps the disturbance of the homogeneity, as explained previously with reference to FIG. 2, low by using (if possible, see further below) a continuous gate oxide region, that is to say that the gate oxide trenches t1, t2, ..., tn run continuously with the exception of the areally small regions with the thick oxide trenches Dt. A CMP process (CMP: chemical mechanical polishing) occurring e.g., later in the process sequence sees relatively homogeneous conditions in the vicinity of the sensor transistor Ts, which leads to a more uniform removal of the layers. The implantation of the body and of the body contact is likewise implemented over the whole area, as far as possible, in order to create more uniform potential conditions.

The layout illustration of FIG. 1 illustrates that in the integrated MOS power switch, a transition from gate oxide trenches t1, t2, ..., tn to thick oxide trenches Dt is necessary only in the x direction since the body regions of the load transistor DMOS and of the sensor transistor Ts have to be electrically isolated and the gate oxide in the gate oxide trenches possibly does not have the required dielectric strength between gate and drain.

It can furthermore be discerned in FIG. 1 that an $n^+$-doped source implant strip Simp lies in the x direction above and below the sensor transistor Ts in order to suppress a possible parasitic MOS transistor at the surface (p-channel at the surface of the $n^-$-doped silicon between the two p-type body regions of the load transistor DMOS and sensor transistor Ts or between the sensor transistor Ts and other p-type regions on the chip).

The above-explained features of the integrated MOS power switch according to the invention, as have been set out above on the basis of the layout illustration in FIG. 1 in contrast to the conventional MOS power switch illustrated in the layout illustration in FIG. 2, will become even clearer below on the basis of the schematic cross-sectional illustrations illustrated in FIGS. 3 to 6.

Figure 6:
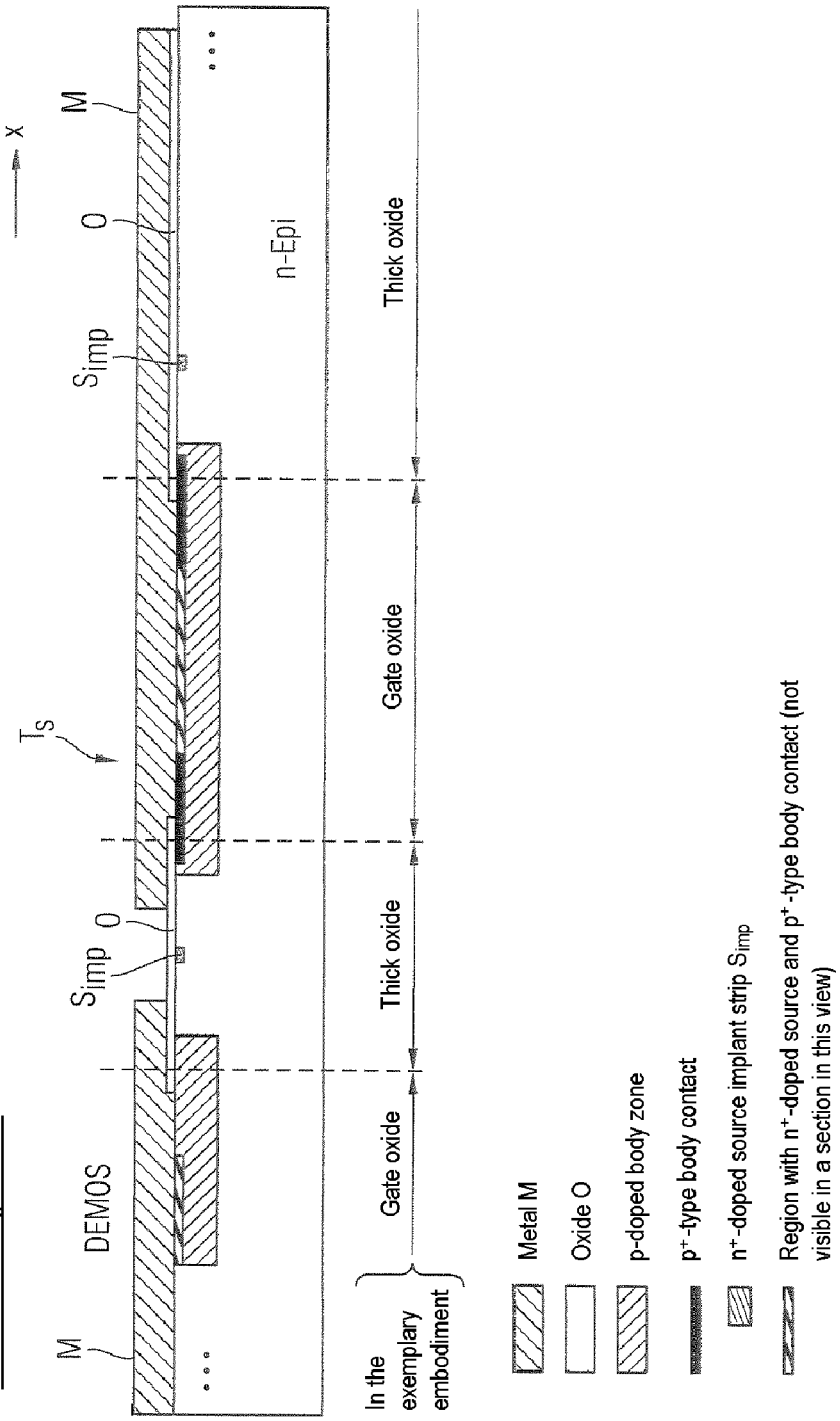
FIG. 6 illustrates a schematic sectional view through a mesa along the sectional line 6-6 in FIGS. 1 and 2, i.e. in trench direction x.
Figure 7:
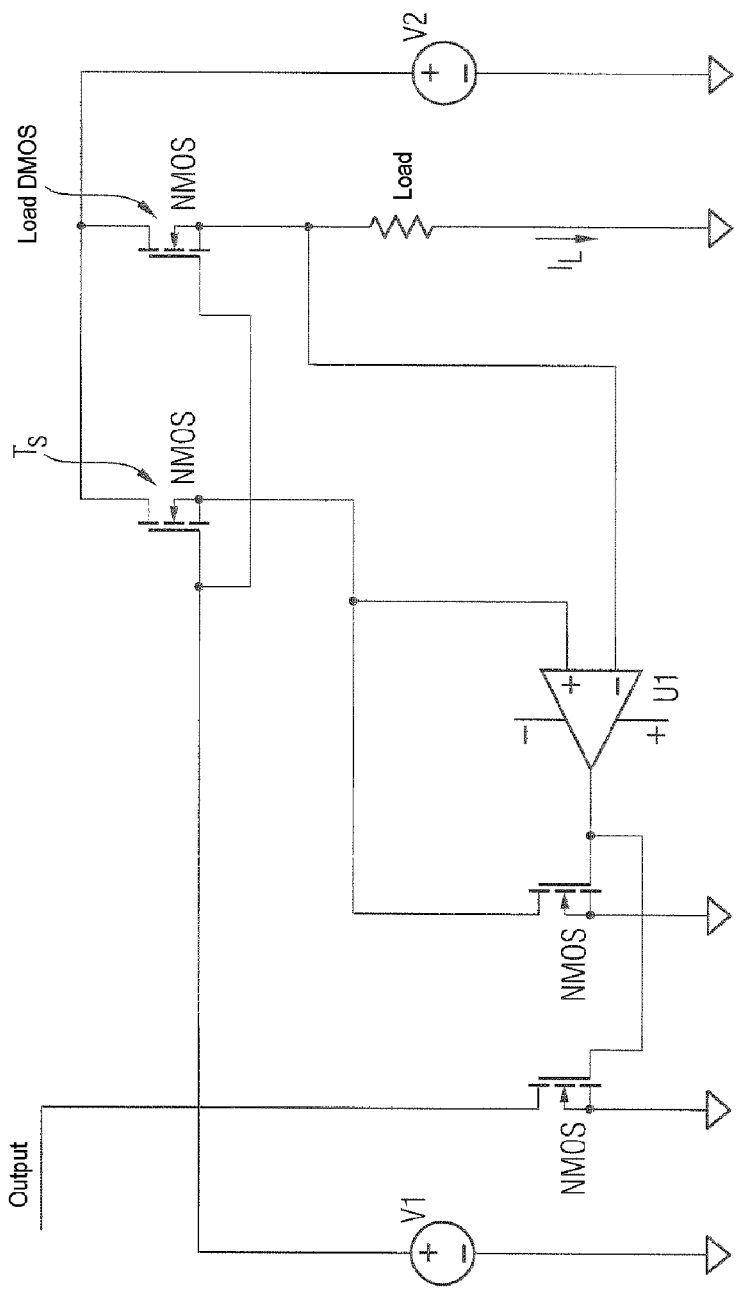
FIG. 7 illustrates a schematic circuit diagram of an integrated MOS power switch which is connected in high-side connection and the load transistor and sensor transistor of which are in each case realized as N-DMOS transistors.

Specifically, FIG. 3 illustrates a cross-sectional illustration in the y direction along the sectional line 3-3' of the exemplary embodiment of the semiconductor device illustrated in the layout in FIG. 1, FIG. 4 illustrates a cross-sectional illustration likewise in the y direction along the sectional line 4-4' of the conventional MOS power switch illustrated in FIG. 2, FIG. 5 illustrates an enlarged excerpt from FIG. 4 designated by the reference symbol A5, and FIG. 6 illustrates a cross section in the x direction through a mesa along the sectional line 6-6' of the exemplary embodiment in accordance with FIG. 1 and of the conventional MOS power switch in accordance with FIG. 2.

The cross-sectional view of FIG. 3 clearly illustrates that the trenches forming the cell array of the sensor transistor Ts correspond to the trenches t1, t2, ..., of the cell array of the load transistor DMOS in terms of their geometry, regular sequence and in terms of their construction on both sides (in the y direction) of the sensor transistor Ts, such that the trenches of the sensor transistor Ts at both of its sides merge uniformly into the trenches of the active cell array of the load transistor DMOS without interruptions or disturbances of the trench geometry in the y direction. The p-doped body implantation is also embodied over the whole area in the exemplary embodiment in the y direction illustrated in FIG. 3. The same is similarly true for the implantation of the body contact $C_B$, which fills the entire width of the mesa lying between the trenches below the oxide layers O and lies in the center of the mesa between two $n^+$-doped source zones outside the oxide layers O. As a precaution, on the left and on the right outside the oxide layers O, a respective mesa is additionally filled with the body and the body contact $C_B$ over its entire width (an inactive mesa), which mesa is contact-connected directly to the source potential of the respective transistor (load DMOS or sensor DMOS) but can also be omitted under specific conditions. As in FIG. 1, the remaining part of the DMOS load transistor has been omitted in FIG. 3, too, in order to be able to better illustrate the details in the region of the sensor transistor Ts. The layout view in FIG. 1 and the sectional view 3-3 in FIG. 3 illustrate the exemplary embodiment on the basis of customary metal design rules for power switches. However, this is not intended to be restrictive, rather the semiconductor device according to the invention can also be realized with narrower design rules. In one embodiment, the distance between active regions of load DMOS and sensor DMOS can then also be reduced in favor of better embedding since a smaller number of mesas that are not contact-connected is therefore required.

The sectional view in FIG. 4 along the sectional line 4-4' from FIG. 2 illustrates that in the conventional MOS power switch in the y direction:
 a transition from gate oxide trenches t1, t2, ... to thick oxide trenches Dt takes place, whereby the symmetry/homogeneity of the DMOS area is already broken relatively early in the production process at these locations, and that
 the implantation both of the p-doped body zone and of the body contact $C_B$ is likewise interrupted at the two sides of the sensor transistor Ts which can be seen in FIG. 4.

This asymmetrical or inhomogeneous transition and the interruption of the body region and of the body contact can be discerned even more clearly in the enlarged excerpt illustration in FIG. 5, which serves only for elucidating details of FIG. 4.

The sectional illustration in FIG. 6 along the sectional line 6-6 firstly makes it clear that this section through a mesa reveals no differences between the conventional and the invention's integrated MOS power switch. Above and below the sensor transistor Ts, it is possible to discern the $n^+$-doped source implant strips Simp, already explained with regard to FIG. 1, under a respective oxide layer O. In the region of the sensor transistor Ts and in that section of the load DMOS which is depicted on the left, it is possible to discern the p-doped body zone and above that the $p^+$-type body contact and a region with $n^+$-doped source and $p^+$-doped body contact (not visible in a section in this view). Furthermore, the sections present in the integrated MOS power switch according to the invention and the transitions from or between gate oxide trenches and thick oxide trenches are indicated in the lower part of FIG. 6, that is to say below the n-type epitaxial layer.

According to the statements above, the proposed exemplary embodiment of the semiconductor device includes at least one of three features in contrast to a conventional solution with regard to the embedding of the current component:

1. At least one side (preferably both sides) of the sensor component merges or merge into the cell array of the DMOS load current component in a regular sequence and in virtually unchanged fashion with regard to the trench geometries used. That is to say that the trenches run uniformly from the cell array to the sensor component without an edge construction and without a change from gate oxide to field oxide in the trench and without such interruptions or disturbances of the trench geometry.

2. At least one side (preferably both sides) of the current sensor merges or merge into the cell array in a regular sequence and in virtually unchanged fashion with regard to the potential distributions (potential geometries) used. That is to say that the potential regions or potential profiles, as seen from the transition from the cell array of the load current component to the sensor transistor, are distributed in identical fashion both into the cell array and into the current sensor. This means, as illustrated in FIG. 3, that the mesa regions which lie below the oxide O and are therefore not directly contact-connected by metal are contact-connected above the sensor component Ts by the region of the load current component DMOS and therefore carry the source potential of the load current component DMOS. This is also the reason why the abovementioned embodiment—chosen "as a precaution"—of the entire mesa width with the body and the body contact and the contact-connection of the respective first mesa regions present laterally (in the y direction) outside the oxide O to the respective source potential is implemented. The potential at the respective mesa adjoining the last active mesa is thus cleanly defined. Moreover, the gate electrodes and further electrodes in the trench on both sides of this transition are present in identical fashion and are in each case at correspondingly identical potentials, and the epitaxial regions on both sides of this transition are likewise present in identical fashion and are in each case at drain potential.

3. At least one side (preferably both sides) of the sensor component and the cell array of the load current component are in contact directly in the sense that there is a distance of less than two pitches between cells which are connected to sensor potential and cells which are connected to cell array potential.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a semiconductor device comprising:
   a power component, having a multiplicity of trenches in a cell array, wherein the trenches run all parallel and at the same distance with respect to one another in same direction; and
   a sensor component, integrated into the cell array of the load current component and having a sensor cell array, an area of which is smaller than an area of the cell array of the power component by a specific factor,
   wherein the trenches forming the cell array of the sensor component correspond to the trenches of the cell array of the load current component, such that the trenches of the sensor component at the at least one side merge uniformly into the trenches of the cell array of the power component without interruptions or disturbances of the trench geometry.

2. The integrated circuit of claim 1, comprising:
   wherein the sensor component is a FET having source, gate and drain electrodes and is integrated as current sensor for detecting a current flowing through the load current component, configured as a FET; and
   wherein on the one hand the gates in each case of the power component and of the sensor component and on the other hand the drain electrodes in each case of the load current component and of the sensor component are shared.

3. The integrated circuit device of claim 1, comprising wherein on both sides of a transition from the cell array of the power component to that of the sensor component the source/body regions of the load current component and of the sensor component are present in identical fashion and a respective source potential can be applied to them.

4. The integrated circuit of claim 1, further comprising a gate electrode in the trenches of the power component and of the sensor component is present in identical fashion and the same potential can be applied to each of them.

5. The integrated circuit of claim 1, wherein the sensor component, at least one side, is directly in contact with one side of the cell array of the load current component in the sense that sensor cells of the sensor component to which sensor potential is applied and cells of the power component to which the cell array potential of said load current component is applied are at a distance of less than two pitches from one another.

6. The integrated circuit of claim 1, wherein the trenches forming the cell array of the sensor component correspond to the trenches of the cell array of the power component in terms of geometry, regular sequence and construction at its other sides, too.

7. The integrated circuit of claim 1, comprising source implant strip provided in the direction of the trenches above and below the sensor component.

8. The integrated circuit of claim 1, wherein the power component and the sensor component are N-DMOS transistors.

9. The integrated circuit of claim 1, wherein the power component and the sensor component are P-DMOS transistors.

10. The integrated circuit of claim 4, wherein further electrodes are present in identical fashion in the trenches of the power component and of the sensor component.

11. The integrated circuit of claim 1, wherein electrodes are provided in the trenches of the cell array; and wherein all the trenches forming the cell array of the sensor component, electrodes formed therein, and an oxide that insulates them are in each case identical in terms of their geometry, regular sequence and their construction and, at least one side of the sensor component in each case correspond to the trenches, the electrodes formed therein and the oxide that insulates them of the cell array of the power component, such that the trenches, the electrodes formed therein and the oxide that insulates them of the sensor component at least one side merge uniformly into the trenches corresponding to them, the electrodes formed therein and the oxide that insulates them of the cell array of the load current component without interruptions or disturbances of their geometry and their construction.

12. The integrated circuit of claim 1, wherein the power component and the sensor component are configured to operate as a power switch.

* * * * *